(12) United States Patent
Yamashita

(10) Patent No.: US 8,916,967 B1
(45) Date of Patent: Dec. 23, 2014

(54) SEMICONDUCTOR DEVICE

(71) Applicant: Panasonic Corporation, Osaka (JP)

(72) Inventor: Kenya Yamashita, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/322,822

(22) Filed: Jul. 2, 2014

(30) Foreign Application Priority Data

Jul. 5, 2013 (JP) .................. 2013-141476
May 9, 2014 (JP) .................. 2014-097433

(51) Int. Cl.
*H01L 23/34* (2006.01)
*H02M 7/00* (2006.01)
*H01L 27/088* (2006.01)

(52) U.S. Cl.
CPC ............. *H02M 7/003* (2013.01); *H01L 27/088* (2013.01); *H01L 23/34* (2013.01)
USPC .......................................... 257/723; 257/76

(58) Field of Classification Search
USPC .................................. 257/76, 723
See application file for complete search history.

(56) References Cited

U.S. PATENT DOCUMENTS

| 6,735,968 | B2 | 5/2004 | Kurita et al. |
| 7,561,429 | B2 | 7/2009 | Yahata et al. |
| 8,228,700 | B2 | 7/2012 | Yahata et al. |

FOREIGN PATENT DOCUMENTS

JP  2001-237368 A  8/2001

*Primary Examiner* — Douglas Menz
(74) *Attorney, Agent, or Firm* — McDermott Will & Emery LLP

(57) ABSTRACT

A semiconductor device includes a semiconductor module including a high-side first transistor and a low-side second transistor, a first control board located above the semiconductor module, a drive element connected to a first gate terminal and a first source terminal of the first transistor on the first control board, and a drive element connected to a second gate terminal and a second source terminal of the second transistor on the first control board, a second control board located above the first control board, and photocouplers provided on the second control board. The semiconductor module includes a positive electrode terminal, a ground terminal, and an output terminal. The first gate terminal and the first source terminal are located at the side provided with the positive electrode terminal and the ground terminal. The second gate terminal and the second source terminal are located at the side provided with the output terminal.

9 Claims, 6 Drawing Sheets

SEMICONDUCTOR DEVICE

CROSS-REFERENCE TO RELATED APPLICATIONS

This application claims priority to Japanese Patent Application No. 2013-141476 filed on Jul. 5, 2013 and Japanese Patent Application No. 2014-097433 filed on May 9, 2014, the entire disclosures of which are incorporated by reference herein.

BACKGROUND

The present disclosure relates to, for example, semiconductor devices applicable to powering, etc.

Higher efficiency in power semiconductor modules for power conversion is demanded in view of low energy consumption.

Most of heat generated in power semiconductor modules in operation is generated from semiconductor elements. In order to reduce the inductance between ground and power sources in half bridge structures to the limit, optimization in the structures of power semiconductor modules is also demanded. To achieve the objective, most suitable structures of power semiconductor modules formed by closely arranging a plurality of semiconductor chips are considered from both the heat and electrical points of view.

FIG. 5 illustrates an example structure of such a conventional power semiconductor module.

As shown in FIG. 5, in the conventional power semiconductor module, a gate terminal 128 and a source terminal 129 provided in a semiconductor module 118 inside a case 116 are electrically connected to a drive element 106 mounted on a control board 208 via a shortest path. Inside the semiconductor module 118, a gate pad and a source pad of a semiconductor element 110 are connected to the gate terminal 128 and the source terminal 129 via wires 109. In the conventional power semiconductor module, control signals converted by a photocoupler 103 mounted on a control board 201 are transmitted to the drive element 106. The control board 208 is electrically connected to the control board 201 by a lead 204. If the lead 204 is long and fine, the ground potential of the control board 208 and the ground potential of the control board 201 fluctuate to easily generate noise. To address the problem, in the conventional structure, the control board 208 is located as close as possible to the control board 201 to reduce the length of the lead 204.

In order to reduce the influence of the lead 204, as shown in FIG. 6A, a conventional semiconductor module is considered, in which a photocoupler 103 and a drive element 106 are mounted close to one another on a same control board 218. In the structure of FIG. 6A, drive signals generated by a control board 211 located above the control board 218 are input to the control board 218 via a lead 214. FIG. 6B illustrates example arrangement of specific components of the control board 218. As shown in FIG. 6B, in each conventional semiconductor module, a photocoupler 103 is located as close as possible to a drive element 106.

Although each of the structures shown in FIGS. 6A and 6B reduces the influence of noise, the temperature of the photocoupler 103 may rise, since the photocoupler 103 is mounted on the control board 218 together with the drive element 106.

In order to reduce the influence of heat, providing a shield between two control boards is considered (see, e.g., Japanese Unexamined Patent Publication No. 2001-237368).

SUMMARY

It is however necessary to increase the distance between the control boards to provide the shield between the two control boards as in the invention of Japanese Unexamined Patent Publication No. 2001-237368. If the distance between the two control boards increases, a long lead is needed to connect the two control boards. This may cause noise.

It is an objective of the present disclosure to provide a semiconductor device which achieves the objective of reducing the influence of noise and the influence of heat.

In order to achieve the objective, a semiconductor device according to a first aspect of the present disclosure includes a semiconductor module including a high-side semiconductor element connected to a first gate terminal and a first source terminal, and a low-side semiconductor element connected to a second gate terminal and a second source terminal; a first control board located above the semiconductor module; a first drive element and a second drive element held by the first control board, the first drive element being connected to the first gate terminal and the first source terminal, and the second drive element being connected to the second gate terminal and the second source terminal; a second control board located above the first control board; and a plurality of photocouplers held by the second control board, output signals of the photocouplers being input to the first drive element or the second drive element. The semiconductor module includes a positive electrode terminal and a ground terminal provided at one side of the semiconductor module, and an output terminal provided at another side opposite to the one side. The first gate terminal and the first source terminal are located at the side of the semiconductor module provided with the positive electrode terminal and the ground terminal. The second gate terminal and the second source terminal are located at the side of the semiconductor module provided with the output terminal.

The present disclosure provides a semiconductor device reducing the influence of noise and the influence of heat.

DETAILED DESCRIPTION

Figure 1A:
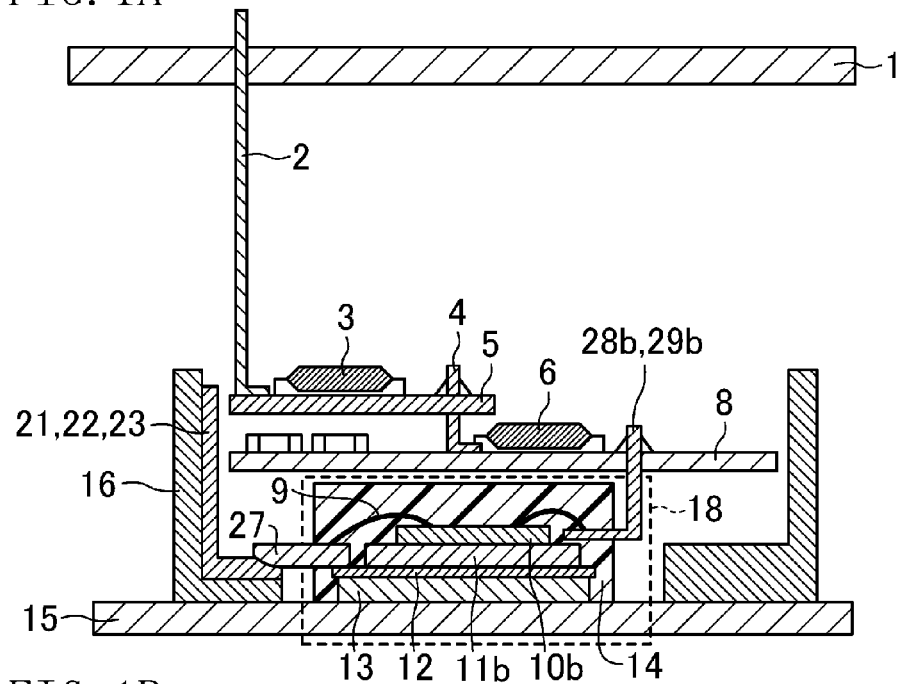
FIG. 1A is a schematic cross-sectional view illustrating a semiconductor device according to a first embodiment of the present disclosure.

Embodiments of the present disclosure will be described hereinafter with reference to the drawings. In the following description, the same reference characters are used to represent equivalent elements, and the explanation thereof will be omitted as appropriate.

First Embodiment

A power semiconductor device according to a first embodiment will be described with reference to FIGS. 1A, 1B, 2A and 2B. FIG. 1B illustrates that three semiconductor modules forming the semiconductor device according to this embodiment are embedded in a case.

Figure 1B:
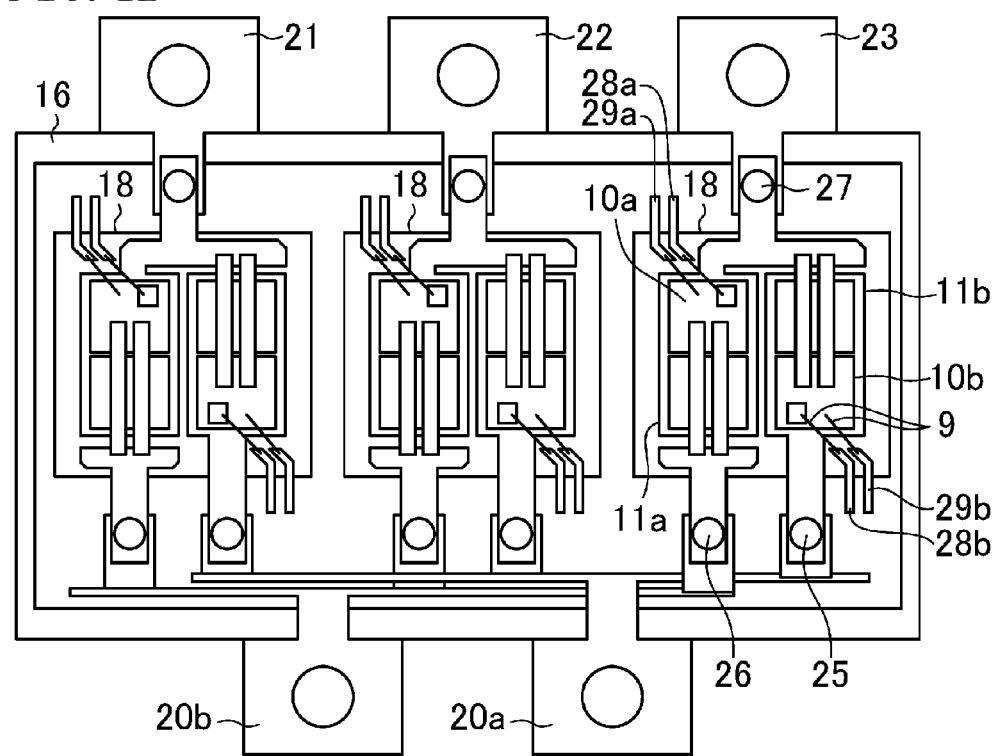
FIG. 1B is a top view illustrating a plurality of semiconductor modules forming the semiconductor device according to the first embodiment of the present disclosure.

As shown in FIG. 1A, three semiconductor modules 18 shown in FIG. 1B and a case 16 containing the modules are located under a first control board 8. In this embodiment, an example will be described where a semiconductor device outputs three-phase power.

As shown in FIG. 1A, the semiconductor device according to this embodiment includes the semiconductor modules 18 contained in the case 16, the first control board 8 contained in the case 16 and located above the semiconductor modules 18, a second control board 5 contained in the case 16 and located above the first control board 8, and a third control board 1 located above the second control board 5.

A circuit including a plurality of drive elements 6 is formed on the first control board 8. A circuit including a plurality of photocouplers 3 capable of transmitting electrical signals in an insulated state is formed on the second control board 5. The first control board 8 is electrically connected to the second control board 5 by a first lead 4. The second control board 5 is electrically connected to the third control board 1 by a second lead 2. The case 16 is mounted on a heat sink 15. In FIGS. 1A-2B, as viewed in plan, the second control board 5 has a smaller area than the first control board 8. The drive elements 6 are, for example, elements driving SiC-MOSFETs made of a wide bandgap material at a high speed.

First, the structures of the semiconductor modules 18 will be described. As shown in FIG. 1B, each of the semiconductor modules 18 includes a first transistor 10b being a high-side semiconductor element, and a second transistor 10a being a low-side semiconductor element.

In general, for example, where transistors having the same polarity are connected in series to an output terminal of a great-power switching circuit to form a half-bridge circuit, the transistor closer to a power source is called a high-side transistor, and the transistor closer to ground is called a low-side transistor.

Each semiconductor module 18 is provided with a positive electrode terminal (i.e., a power source terminal) 25, which is directly drawn from a first die pad 11b holding the high-side first transistor 10b, and a ground terminal (i.e., a negative electrode terminal) 26, which is electrically connected to the low-side second transistor 10a, at the lower side in the figure. An output terminal 27, which is directly drawn from a second die pad 11a holing the low-side second transistor 10a, is located at the upper side in the figure. As such, as a structure of each semiconductor module 18, the positive electrode terminal 25 and the ground terminal 26 are preferably located at the same side, and the output terminal 27 is preferably located at the side opposite to the side provided with the positive electrode terminal 25 and the ground terminal 26.

The low-side second transistor 10a is metallically jointed onto the second die pad 11a. A drain electrode of the second transistor 10a is connected to the output terminal 27. A source electrode of the second transistor 10a is connected to the ground terminal 26, for example, by a plurality of aluminum ribbons. The high-side first transistor 10b is metallically jointed onto the first die pad 11b. A drain electrode of the first transistor 10b is connected to the positive electrode terminal 25. A source electrode of the first transistor 10b is connected to the output terminal 27, for example, by a plurality of aluminum ribbons.

A first gate terminal 28b and a first source terminal 29b connected to the high-side first transistor 10b are provided at the high side at which the positive electrode terminal 25 and the ground terminal 26 are located. On the other hand, a second gate terminal 28a and a second source terminal 29a connected to the low-side second transistor 10a are provided at the low side at which the output terminal 27 is located. A gate pad and a source pad of the second transistor 10a are connected to the second gate terminal 28a and the second source terminal 29a by respective wires 9. Similarly, a gate pad and a source pad of the first transistor 10b are connected to the first gate terminal 28b and the first source terminal 29b by respective wires 9.

An opening is formed at the bottom of the case 16. The heat sink 15 is exposed from the opening. On the other hand, the die pads 11a and 11b, on which the transistors 10a and 10b are mounted, are provided on a single heat dissipater 13 via an insulating member 12. The heat dissipater 13 is fixed onto the heat sink 15 at the opening of the case 16. This structure electrically insulates the die pads 11a and 11b from the heat dissipater 13, and efficiently releases the heat, which is generated from the transistors 10a and 10b, from the heat dissipater 13 to the heat sink 15. The insulating member 12 is made of a material having high voltage resistance and high thermal conductivity. In each semiconductor module 18, the heat dissipater 13, the insulating member 12, the die pads 11a and 11b, the transistors 10a and 10b, and the wires 9 are integrally sealed on the heat sink 15 by sealing resin 14.

The positive electrode terminals 25 and the ground terminals 26 of the semiconductor modules 18 are metallically jointed to a positive electrode-side bus bar 20a and a ground-side bus bar 20b respectively, which are fixed to the case 16 being a support body. The output terminals 27 of the semiconductor modules 18 are metallically jointed to an UO terminal 21, a VO terminal 22, and a WO terminal 23, which are embedded in the case 16.

The first control board 8 located directly above the three semiconductor modules 18 is supported by the case 16. The first control board 8 is provided with a control circuit (e.g., a gate drive circuit) including the drive elements 6, etc.

Figures 2A, 2B:
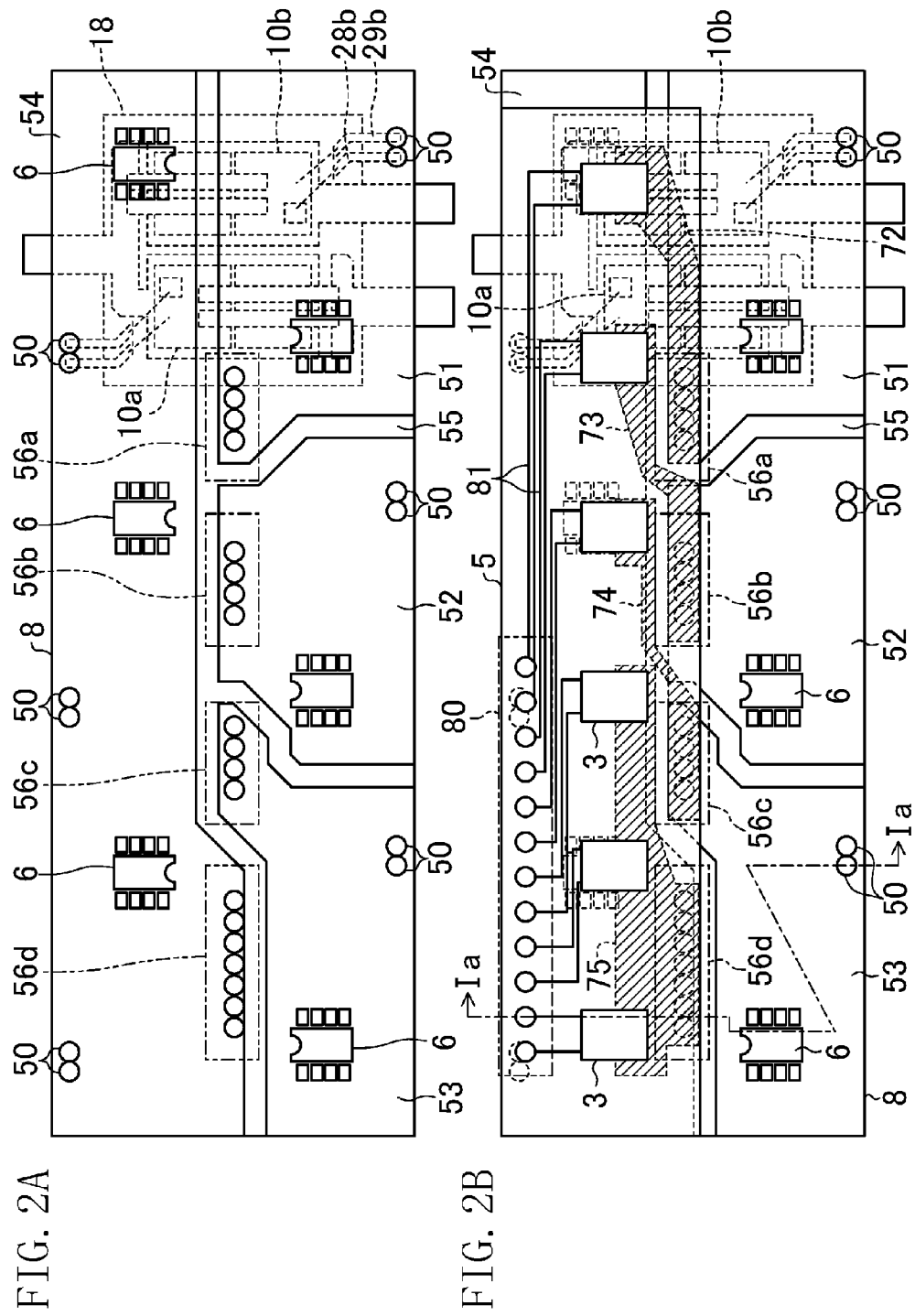
FIG. 2A is a schematic top view illustrating a first control board forming the semiconductor device according to the first embodiment of the present disclosure.
FIG. 2B is a schematic top view illustrating a second control board forming the semiconductor device according to the first embodiment of the present disclosure.

As shown in FIGS. 1A and 2B, in each semiconductor module 18, for example, the first gate terminal 28b and the first source terminal 29b of the high-side first transistor 10b are electrically connected to the output terminal of one of the drive elements (i.e., a first drive element) 6 mounted on the first control board 8. Although not shown, the second gate terminal 28a and the second source terminal 29a of the low-side second transistor 10a are electrically connected to the output terminal of the other one of the drive element (i.e., a second drive element) 6 mounted on the first control board 8. With this structure, the drive elements 6 are connected to the gate pads and the source pads of the transistors 10a and 10b via shortest paths. As a result, each semiconductor module according to this embodiment reduces the inductance between the gates and the sources to improve gate controllability.

As shown in FIG. 1B, where the three semiconductor modules 18 are arranged such that the low-side second transistors 10a and the high-side first transistors 10b are aligned in the same direction, the second gate terminals 28a and the second source terminals 29a of the second transistors 10a are all located at the low side. On the other hand, the first gate terminals 28b and the first source terminals 29b of the first transistors 10b are all located at the high side. In this embodiment, as described above, the first gate terminal 28b and the first source terminal 29b of each high-side first transistor 10b are located close to the positive electrode terminal 25 and the ground terminal 26, while the second gate terminal 28a and the second source terminal 29a of the low-side second transistor 10a are located close to the output terminal 27. Relative to such arrangement of the terminals, the first control board 8 is provided as shown in FIG. 2A.

FIG. 2A is a top view illustrating the structure of the first control board 8. In FIG. 2A, broken lines represent one of the semiconductor modules 18 covered by the first control board 8.

As shown in FIG. 2A, the first gate terminals 28b and the first source terminals 29b are connected to respective through-holes 50 provided in high-side first circuit regions 51, 52, and 53. As an example, the first circuit region 51 is a high-side W-phase control circuit region, the first circuit region 52 is a high-side V-phase control circuit region, and the first circuit region 53 is a high-side U-phase control circuit region. In this embodiment, the high-side first circuit regions 51-53 are provided to correspond to the three semiconductor modules 18.

As shown in FIG. 2A, the second gate terminals 28a and the second source terminals 29a are connected to respective through-holes 50 located in a low-side second circuit region 54. The second circuit region 54 is, for example, a low-side control circuit region.

As described above, in the semiconductor device according to this embodiment, the high-side first circuit regions 51-53 are located above the high-side U-phase, V-phase, and W-phase first transistors 10b, respectively. The low-side second circuit region 54 is located above the low-side U-phase, V-phase, and W-phase second transistors 10a. In this embodiment, this structure connects the drive elements 6 to the gate pads and the source pads of the transistors 10a and 10b to be controlled via shortest paths, with the potential of the arm elements on the first control board 8 being independent from one another. As a result, the inductance between the gates and the sources reduces, thereby providing excellent gate controllability.

Since circuit components such as drive elements 6 are provided in the circuit regions 51-54, the circuit components are preferably insulated from one another. In this embodiment, an insulating region 55 not provided with the circuit components or conductive patterns is formed to insulate and isolate the boundaries between the circuit regions 51-54. Specifically, the insulating region 55 insulates and isolates the boundary between the low-side second circuit region 54 and the high-side first circuit regions 51-53, and insulates and isolates the boundaries between the high-side first circuit regions 51 and 52, and between the high-side first circuit regions 52 and 53.

On the first control board 8, a plurality of connectors 56a-56d are linearly arranged as viewed in plan in regions of the high-side first circuit regions 51-53, which face the low-side second circuit region 54, and a region of the second circuit region 54, which faces the high-side first circuit region 53, respectively. That is, the plurality of connectors 56a-56d are linearly arranged as viewed in plan in the vicinity of the boundary between the high-side first circuit regions 51-53 and the low-side second circuit region 54. The connectors 56a-56d are, for example, control signal connectors.

FIG. 2B is a top view illustrating the structure of the second control board 5. In FIG. 2B, broken lines represent one of the semiconductor modules 18 covered by the second control board 5 and the first control board 8.

As shown in FIG. 2B, a plurality of low-side control signal lines of the first control board 8 are connected to control signal lines located in a wiring region 75 of the second control board 5 by the connectors 56d. Similarly, a plurality of high-side control signal lines of the first control board 8 are connected to control signal lines located in wiring regions 72-74 of the second control board 5 by the connectors 56a, 56b, and 56c, respectively. The wiring regions 72-75 are, for example, control signal wiring regions.

A plurality of signal lines 81 connecting a signal input section 80 of the second control board 5 to the photocouplers 3 are preferably located above the low-side second circuit region 54 of the first control board 8. In this embodiment, since the first control board 8 is mounted close to the second control board 5, a low voltage signal line (e.g., a signal line allowing a logic signal with a voltage of 5V or lower to flow) can be located not close to the high-side first circuit regions 51-53 which cause voltage fluctuations of hundreds volts but in the low-side second circuit region 54, thereby reducing the influence of noise.

In this embodiment, power semiconductor elements such as SiC-MOSFETs can be operated at a high speed by setting the length of the first lead 4, which is the distance between the first control board 8 and the second control board 5, to 20 mm or shorter. For example, if the length of the first lead 4 is longer than 20 mm, the ground potential of the first control board 8 differs from the ground potential of the second control board 5 in high speed operation. Then, logic values of signals input from the photocouplers 3 to the drive elements 6 may not be held. More specifically, assume that the minimum signal transmittance speed is (20 mm)/(70% of the speed of light), which is the ratio of the length of the lead to the signal transmittance speed in the lead, in high speed operation in which the voltage change rate of each phase output varies by 50 kV/µs. This prevents the ground potential difference of 0.48 V, which corresponds to the threshold of logic determination of a general drive element. According to the verification of the present inventors, operation at 50 kV/µs or lower is possible where the first lead 4 has a length of 20 mm or shorter.

A drive signal generation circuit including a microcomputer is provided on the third control board 1 located above the second control board 5. Drive signals are output from the third control board 1 via the second lead 2 to the signal input section 80 of the second control board 5. While the third control board 1 is preferably connected to the second control board 5 at a short distance, the distance between the third control board 1 and the second control board 5 is not limited as long as the quality of the signals is not damaged.

As described above, in the semiconductor device according to this embodiment, the photocouplers 3 are mounted on the second control board 5 and the drive elements 6 are mounted on the first control board 8 located under the second control board 5. This keeps the heat sensitive elements such as the photocouplers 3 away from the semiconductor modules 18 whose temperatures rise in operation. Therefore, a highly reliable semiconductor device is provided.

As described above, the semiconductor device according to this embodiment reduces the influence of noise on logic signals caused by potential fluctuations at the low side. Therefore, the semiconductor device according to this embodiment reduces the influence of noise and the influence of heat without using a shield against the heat.

Second Embodiment

Figure 3:
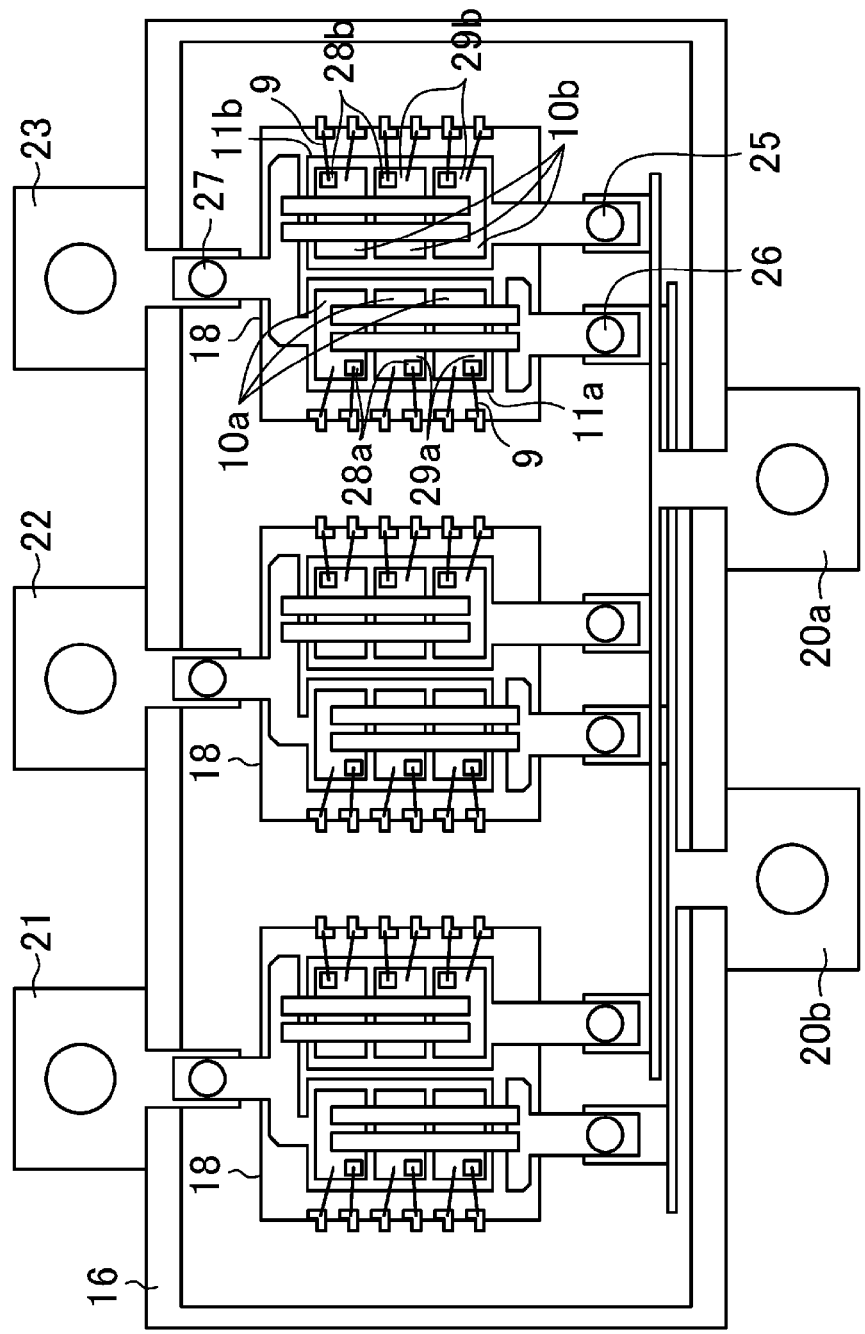
FIG. 3 is a schematic top view illustrating a plurality of semiconductor modules forming a semiconductor device according to a second embodiment of the present disclosure.
Figures 4A, 4B:
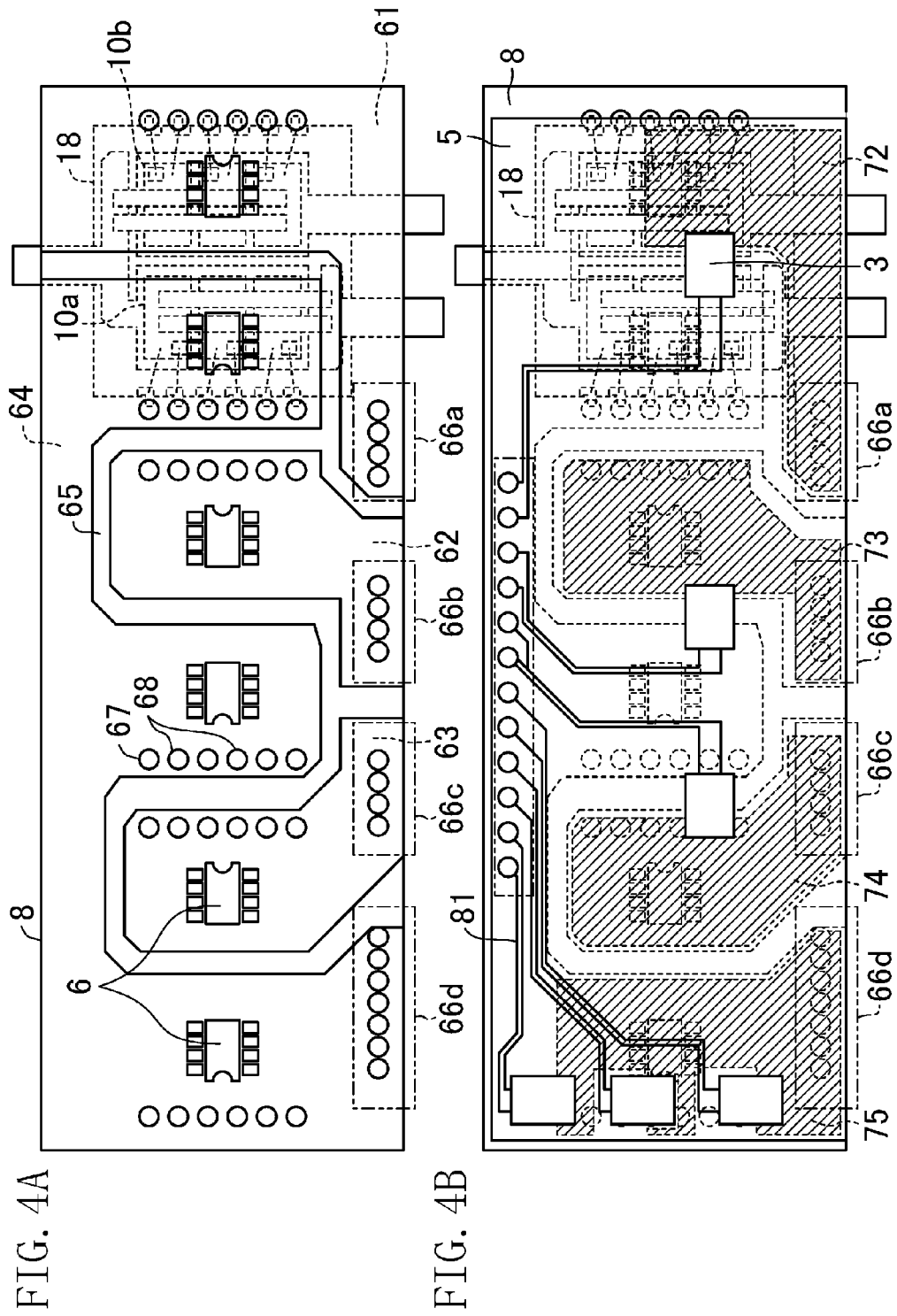
FIG. 4A is a schematic top view illustrating a first control board forming the semiconductor device according to the second embodiment of the present disclosure.
FIG. 4B is a schematic top view illustrating a second control board forming the semiconductor device according to the second embodiment of the present disclosure.
Figure 5:
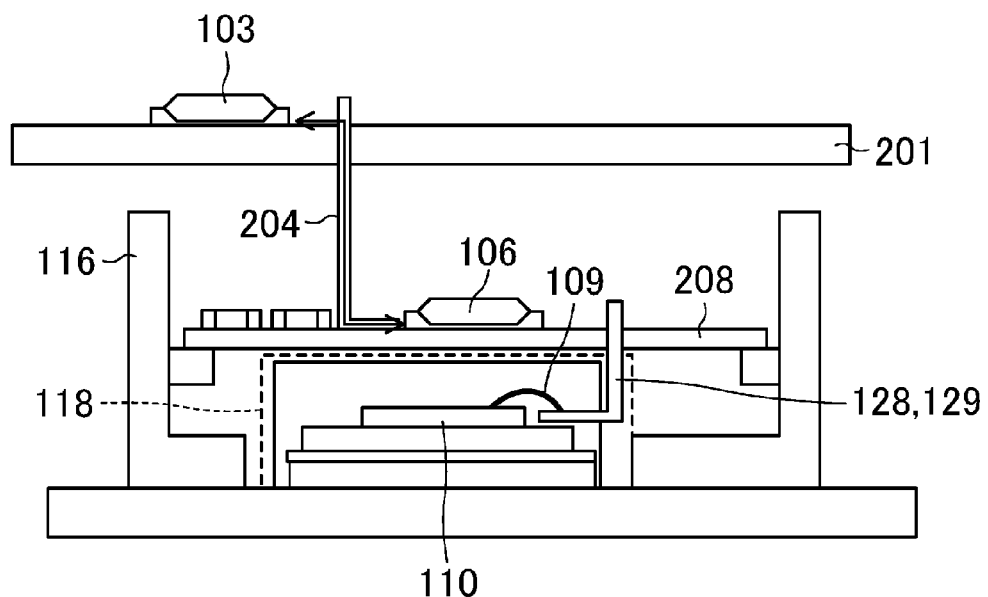
FIG. 5 is a cross-sectional view illustrating a conventional power semiconductor module.
Figure 6A:
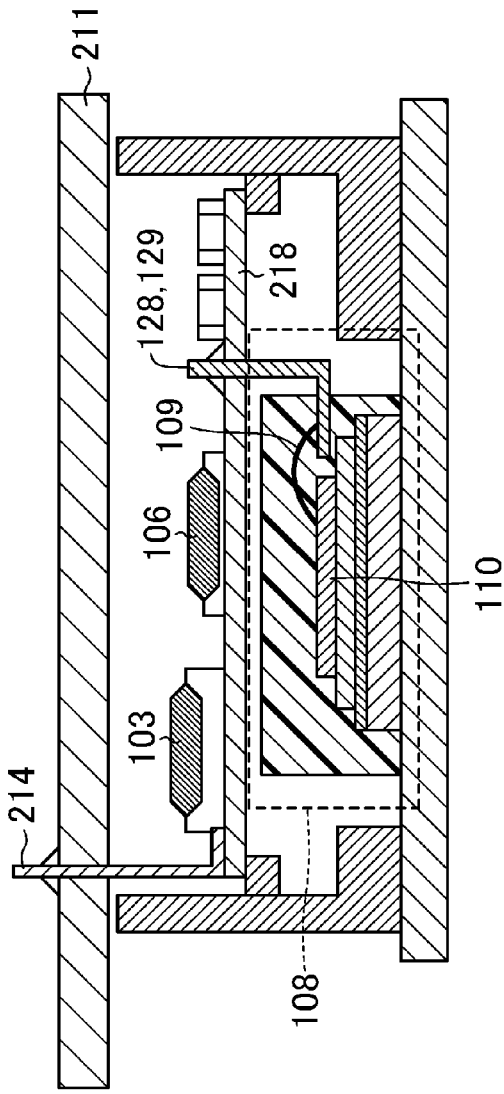
FIG. 6A is a cross-sectional view illustrating another conventional semiconductor module.
Figure 6B:
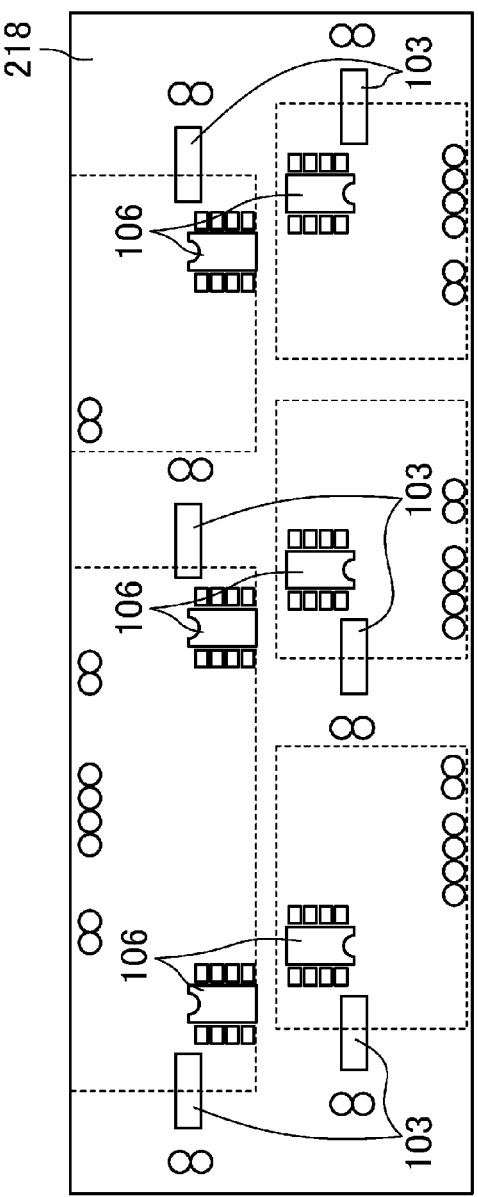
FIG. 6B is a top view illustrating arrangement of components of conventional semiconductor modules on a control board.

Semiconductor modules forming a power semiconductor device according to a second embodiment will be described hereinafter with reference to FIGS. 3, 4A, and 4B. FIG. 3 illustrates how to mount three semiconductor modules included in the semiconductor device according to this embodiment.

As shown in FIG. 3, each semiconductor module 18 includes a positive electrode terminal 25, a ground terminal 26, an output terminal 27, a plurality of gate terminals 28a and 28b, and a plurality of source terminals 29a and 29b. A low-side second transistor 10a is formed by, for example, connecting three elements in parallel and metallically jointing the elements onto a second die pad 11a, from which the output terminal 27 is drawn. The source electrode of the low-side second transistor 10a is connected to the ground terminal 26 by a plurality of aluminum ribbons. A high-side first transistor 10b is formed by, for example, connecting three elements in parallel and metallically jointing the elements onto a first die pad 11b, from which the positive electrode terminal 25 is drawn. The source electrode of the high-side first transistor 10b is connected to the output terminal 27 by a plurality of aluminum ribbons.

In the structure of each semiconductor module 18, the positive electrode terminal 25 and the ground terminal 26 are preferably located at one side, and the output terminal 27 is preferably located at the side opposite to the one side. While the low-side second transistor 10a and the high-side first transistor 10b included in each semiconductor module 18 are formed by three elements, the number of the elements is not limited to three. Each semiconductor module 18 reduces inductance by using bus bars for wiring or other structures. In this embodiment, a plurality of chips are arranged in a line to form each of the low-side second transistor 10a and the high-side first transistor 10b to connect the chips to the gate terminals 28a and 28b and the source terminals 29a and 29b via shortest paths using respective wires 9.

As such, in arranging the plurality of transistors 10a and 10b at a low side and a high side, the gate terminals 28a and 28b and the source terminals 29a and 29b are not preferably connected to the side provided with the positive electrode terminal 25 and the ground terminal 26, and the side provided with the output terminal 27. With this structure, since the lengths of wires of the gate terminals 28a and 28b and the source terminals 29a and 29b are not equal, the transistors 10a and 10b are difficult to be switched at the same time. As shown in FIG. 3, the gate terminals 28a and 28b and the source terminals 29a and 29b are preferably located in a region not provided with the positive electrode terminal 25, the ground terminal 26, or the output terminal 27 such that the lengths of the wires are equal. This structure enables more stable parallel drive. The gate terminals 28a and 28b and the source terminals 29a and 29b may be provided for each chip, or may be connected inside each semiconductor module 18 except for each single pair located outside.

In this embodiment, as shown in FIG. 3, for example, where three semiconductor modules 18 are provided in the same direction, the arrangement of the gate terminals 28a and 28b and the source terminals 29a and 29b is different from that of the first embodiment. Different from the arrangement of the terminals, FIG. 4A illustrates example arrangement of drive elements 6 and through-holes 67 and 68 on a first control board 8. The through-holes 67 are, for example, gate terminal through-holes, while the through-holes 68 are, for example, source terminal through-holes.

The gate terminals 28a and 28b and the source terminals 29a and 29b, which are connected to the low-side second transistors 10a corresponding to the U-phase, V-phase, and W-phase of the semiconductor modules 18, are connected to the through-holes 67 and 68 provided in a second circuit region 64. Similarly, the gate terminals 28a and 28b and the source terminals 29a and 29b, which are connected to the high-side first transistors 10b corresponding to the U-phase, V-phase, and W-phase, are connected to the through-holes 67 and 68 provided in each of first circuit regions 61, 62, and 63. Circuit components such as drive elements 6 are provided in the circuit regions 61-64. An insulating region 65 not provided with the circuit components or conductive patterns is formed at the boundaries between the circuit regions 61-64. In this embodiment, the insulating region 65 separates the high-side circuit regions 61-63 from the low-side circuit region 64 in the vertical direction of the substrate (i.e., the lateral direction of FIG. 4A) and separates at boundaries between the high-side circuit regions 61 and 62 and between the high-side circuit regions 62 and 63.

In this embodiment, the low-side second circuit region 64 is located above the U-phase, V-phase, and W-phase low-side second transistors 10a. Similarly, the high-side first circuit regions 61-63 are located above the U-phase, V-phase, and W-phase high-side first transistors 10b. This structure connects the drive elements 6 to the gate pads and the source pads of the transistors 10a and 10b to be controlled via the shortest paths, with the potential of the low and high sides being independent from one another. As a result, the inductance between the gates and the sources reduces, thereby providing excellent gate controllability. A plurality of terminal through-holes 66 for supplying control signals and power are provided in the circuit regions 61, 62, 63, and 64.

A second control board 5 is located directly above the first control board 8. The control circuit formed above the second control board 5 insulates a drive signal generation circuit including photocouplers 3 from the semiconductor modules 18. FIG. 4B illustrates example overlapping where a second control board 5 is located directly above a first control board 8 having the structure shown in FIG. 4A.

Low-side signal lines of the first control board 8 are connected to control signal lines located in a wiring region 75 by connectors 66d of the second control board 5. This connects input terminals of the drive elements 6 at the low side to output terminals of the photocouplers 3. Similarly, high-side signal lines of the first control board 8 are connected to control signal lines located in wiring regions 72, 73, and 74 by connectors 66a, 66b, and 66c, respectively, on the second control board 5. This connects input terminals of the drive elements 6 at the high side to the output terminals of the photocouplers 3. Signal lines 81 connecting a signal input section 80 of the second control board 5 to the photocouplers 3 are preferably located on the low-side second circuit region 64 of the first control board 8.

For example, the first control board 8 is mounted close to the second control board 5. The control signals are logic signals with a voltage of 5 V or lower. If formed across the high-side first circuit regions 61-63 causing voltage fluctuations of hundreds volts at a short distance, such low voltage signal lines are influenced by noise. In order to reduce the influence of noise, these low voltage signal lines are preferably located above the low-side second circuit region 64. As described above in the first embodiment, power semiconductor elements such as SiC-MOSFETs can be operated at a high speed by setting the length of the first lead 4, which is the distance between the first control board 8 and the second control board 5, to 20 mm or shorter.

A drive signal generation circuit including a microcomputer is mounted on a third control board 1. Drive signals are output from the third control board 1 via a second lead 2 to the signal input section of the second control board 5.

As described above, the photocouplers 3 and the drive elements 6 are mounted separately on the second control board 5 and on the first control board 8, respectively. This keeps the heat sensitive elements such as the photocouplers 3 away from the semiconductor modules 18 whose temperatures rise in operation. Therefore, the semiconductor device according to the present disclosure secures high reliability. The photocouplers 3 are provided not on the third control board 1 but on the second control board 5, thereby mounting the photocouplers 3 at a distance of 20 mm or shorter from the first control board 8. The drive elements 6 are thus mounted close to the photocouplers 3. As a result, high speed drive elements such as SiC-MOSFETs are stably operated by parallel drive under a high temperature.

The semiconductor device according to the present disclosure provides high reliability and are useful for power semiconductor devices, etc.

What is claimed is:

1. A semiconductor device comprising:
   a semiconductor module including
      a high-side semiconductor element connected to a first gate terminal and a first source terminal, and
      a low-side semiconductor element connected to a second gate terminal and a second source terminal;
   a first control board located above the semiconductor module;
   a first drive element and a second drive element held by the first control board, the first drive element being connected to the first gate terminal and the first source terminal, and the second drive element being connected to the second gate terminal and the second source terminal;
   a second control board located above the first control board; and
   a plurality of photocouplers held by the second control board, output signals of the photocouplers being input to the first drive element or the second drive element, wherein
   the semiconductor module includes
      a positive electrode terminal and a ground terminal provided at one side of the semiconductor module, and
      an output terminal provided at another side opposite to the one side,
   the first gate terminal and the first source terminal are located at the side of the semiconductor module provided with the positive electrode terminal and the ground terminal, and
   the second gate terminal and the second source terminal are located at the side of the semiconductor module provided with the output terminal.

2. The semiconductor device of claim 1, wherein
a positive electrode terminal is drawn from a first die pad holding the high-side semiconductor element,
an output terminal is drawn from a second die pad holding the low-side semiconductor element, and
the low-side semiconductor element is electrically connected to a ground terminal.

3. The semiconductor device of claim 1, wherein
the first control board is segmented into a plurality of circuit regions including a high-side first circuit region and a low-side second circuit region, and
an insulating region is formed between each adjacent pair of the circuit regions.

4. The semiconductor device of claim 3, wherein
a plurality of signal lines connecting a signal input section of the second control board to the photocouplers are located above the low-side second circuit region of the first control board.

5. The semiconductor device of claim 3, wherein
a connector connecting a low-side control signal line of the first control board to a control signal line of the second control board is located in a vicinity of a region between the first circuit region and the second circuit region on the first control board.

6. The semiconductor device of claim 5, wherein
the connector includes a plurality of connectors linearly arranged as viewed in plan in the vicinity of the region between the first circuit region and the second circuit region on the first control board.

7. The semiconductor device of claim 1, wherein
the second control board has a smaller area than the first control board as viewed in plan.

8. The semiconductor device of claim 1, wherein
a lead connecting the first control board to the second control board has a length of 20 mm or shorter.

9. The semiconductor device of claim 1, wherein
each of the high-side semiconductor element and the low-side semiconductor element is a device made of a wide bandgap material.

* * * * *